United States Patent [19]
Heyers et al.

[11] Patent Number: 6,030,515
[45] Date of Patent: Feb. 29, 2000

[54] METHOD FOR FABRICATING METAL MICROPATTERNS

[75] Inventors: Klaus Heyers, Reutlingen; Bernhard Elsner, Kornwestheim, both of Germany

[73] Assignee: Robert Bosch GmbH, Stuttgart, Germany

[21] Appl. No.: 09/121,081

[22] Filed: Jul. 23, 1998

[30] Foreign Application Priority Data

Jul. 26, 1997 [DE] Germany .................. 197 32 250

[51] Int. Cl.[7] ........................................... C25D 5/02
[52] U.S. Cl. .................................................. 205/118
[58] Field of Search ............................... 205/118, 159, 205/205

[56] References Cited

U.S. PATENT DOCUMENTS

| | | | |
|---|---|---|---|
| 4,643,804 | 2/1987 | Lynch et al. | 204/15 |
| 4,849,370 | 7/1989 | Spratt et al. | 437/71 |
| 4,874,484 | 10/1989 | Foell et al. | 204/129.3 |
| 5,547,557 | 8/1996 | Asai et al. | 205/118 |
| 5,559,058 | 9/1996 | Zory, Jr. et al. | 437/237 |
| 5,646,464 | 7/1997 | Sickafus | 310/40 MM |

*Primary Examiner*—Kathryn Gorgos
*Assistant Examiner*—Erica Smith-Hicks
*Attorney, Agent, or Firm*—Kenyon & Kenyon

[57] ABSTRACT

A method for fabricating metal micropatterns. Trenches are introduced into a polymer layer. These trenches are filled with the metal micropatterns using an electroplating process. Before the deposition of the metal micropatterns, the side walls of the trenches are covered with insulating layers which adhere to the metal micropatterns after the polymer layer is removed.

8 Claims, 2 Drawing Sheets

METHOD FOR FABRICATING METAL MICROPATTERNS

FIELD OF THE INVENTION

The present invention relates to a method for fabricating metal micropatterns.

BACKGROUND INFORMATION

In conventional methods for fabricating metal micropatterns, trenches are introduced in a polymer layer. Through electroplating, the trenches are then filled with metal micropatterns and the polymer layer is removed. Here, the micropatterns are made entirely of metal and are not insulated electrically from each other.

SUMMARY OF THE INVENTION

In accordance with an exemplary embodiment of the present invention, a method is provided which has the advantage that, in a simple manner, metal micropatterns are fabricated whose side walls are covered by an insulating layer. Voltages can then be applied to the metal micropatterns without the risk that, when the metal micropatterns are touched (i.e., contacted), a short circuit will occur or noticeable currents will flow.

In a particularly simple way, the insulating layer is first applied across the entire surface and then is patterned using an anisotropic etching process. The method can also be used advantageously on silicon wafers already having switching circuits. In addition, movable metal micropatterns can be fabricated by being partially arranged on sacrificial layers. By introducing additional trenches, which are not provided with an insulating layer on the side wall, metal micropatterns can be selectively fabricated as partly insulated and partly not insulated. Micropatterns of this type can be used for many purposes.

DETAILED DESCRIPTION OF THE INVENTION

Figure 1:
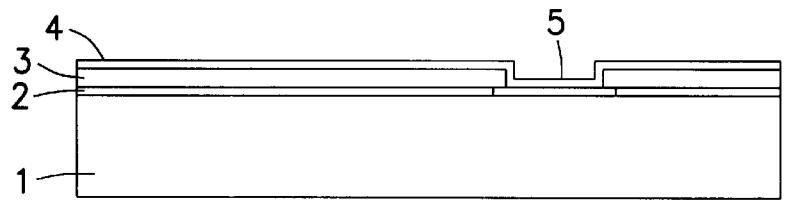
FIG. 1 illustrates a result of a first step of the method in accordance with an exemplary embodiment of the present invention.

In FIG. 1, a silicon substrate 1 is depicted, in which semiconductor patterns have already been introduced. These semiconductor patterns, however, are not depicted in FIG. 1. Instead, a superficial passivation layer 2 on which a contacting site 5 is fabricated at one location is shown. Through contacting site 5, it is possible to produce an electrical contact with the electrical switching circuits (not shown) in silicon substrate 1. Passivation layer 2 functions as a protective layer for the semiconductor switching circuit which is introduced. A first polymer layer 3, for example, a photoresist, is then applied to this surface and patterned. The thickness of the first polymer layer 3 is in the order of magnitude of a few micrometers (typically 5 micrometers). The first polymer layer 3 is patterned in such a way that contacting site 5 is not covered by the polymer layer 3. In a further process step, an electroplating-starting layer 4 is then applied, which is, for example, a 300 nanometer thick layer of chromium-copper, the chromium functioning to create a good bond with the base and, in particular, with contacting site 5. Copper is very well suited as an electroplating starting layer. The method step, thus arrived at, is illustrated in FIG. 1 in cross section.

In a subsequent step, a thick, second polymer layer 7 is then applied, whose thickness is in the order of magnitude of 10 micrometers. For this purpose, a thick photo-resist layer, for example, can be spin-deposited and cured at 2000° C. On the upper side of the second polymer layer, deposited in this manner, a mask is applied which assists in the patterning of second polymer layer 7. The mask, for example, a thin silicon dioxide layer in the order of magnitude of 600 nanometers, may be deposited. The thin silicon dioxide layer may then be patterned using a thin photoresist. The second polymer layer 7 is then patterned right through this mask. This occurs, for example, using an anisotropic plasma etching process, with which very steep trenches 8 are etched into polymer layer 7 down to electroplating-starting layer 4. Trenches 8, etched in this way, function as the mold for the metal micropatterns which are fabricated in a further process.

Before the creation of the metal micropatterns themselves begins, an insulating layer 9 is first deposited on the entire surface, i.e., on the upper side of polymer layer 7, on the side walls of trenches 8, and on electroplating-starting layer 4, exposed at the base of trenches 8. Well suited for this purpose is, for example, a conventional plasma deposition process in which silicon oxide, silicon nitride or a mixture of these two materials is deposited. Furthermore, plasma-deposition methods are known in which metal oxides, likewise having insulating properties, can be deposited. Any of these deposition processes can be used for the production of insulating layer 9. Subsequently, a further etching step is performed, having a pronounced anisotropy. In this context, surfaces parallel to substrate 1 are sharply (i.e., strongly) etched, whereas surfaces perpendicular thereto are essentially not etched. Particularly well suited for this purpose are anisotropic plasma etching processes which, because of their etching action predominantly perpendicular to the substrate, essentially only etch those surfaces aligned parallel to the substrate.

Figure 2:
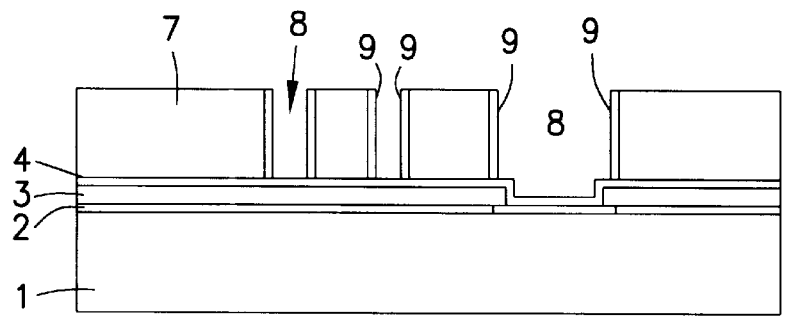
FIG. 2 illustrates a result of a subsequent step of the method in accordance with the exemplary embodiment of the present invention.

The etching process is continued until insulating layer 9 is removed in the area of the bases of trenches 8, so that electroplating-starting layer 4 is exposed in the area of the bases of trenches 8. In this context, the insulating layer on the upper side of second polymer layer 7 is also removed. The condition reached in this way is illustrated in FIG. 2, in which trenches 8 can be seen whose side walls are furnished with an insulating layer 9, while the base of trench 8 shows no insulating layer.

Figure 3:
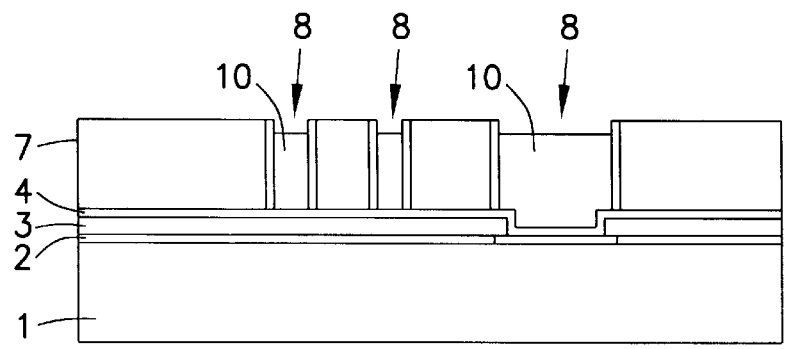
FIG. 3 illustrates a result of another subsequent step of the method in accordance with the exemplary embodiment of the present invention.
Figure 4:
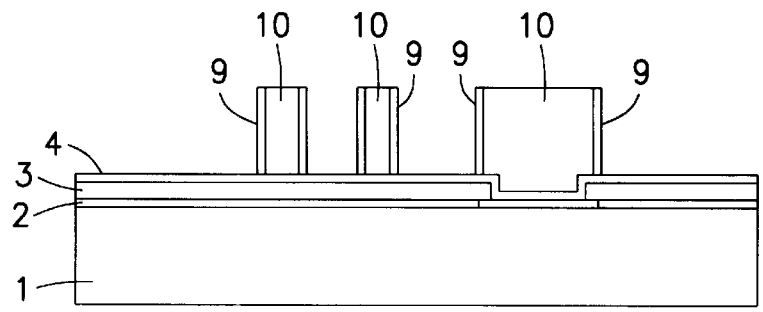
FIG. 4 illustrates a result of another subsequent step of the method in accordance with the exemplary embodiment of the present invention.

In a further step, the electroplating of the metal micropatterns takes place. This can occur, for example, using nickel electroplating, so that trenches 8 are filled with metal micropattern 10. This is shown in FIG. 3 in cross section. In the area of contacting site 5, in this context, metal micropattern 10 is permanently bonded to substrate 1. The remaining areas of metal micropattern 10 are arranged on electroplating-starting layer 4 and first polymer layer 3 below that.

In the next process step, second polymer layer 7 is then removed. This occurs, for example, with the use of an O₂/CF₄-plasma.

In the next process step, exposed electroplating-starting layer 4 is then removed. This occurs, for example, through a wet-chemical selective etching step, which attacks only electroplating-starting layer 4 and not metal micropatterns 10. The electroplating-starting layer, in this context, is removed only in the exposed areas, i.e., electroplating-starting layer 4 remains underneath metal micropatterns 10.

Figure 5:
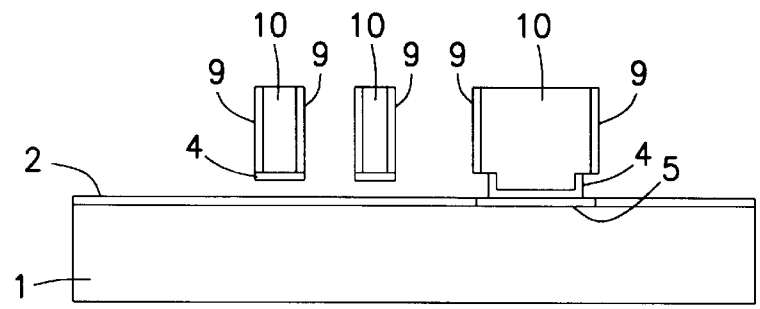
FIG. 5 illustrates a result of another subsequent step of the method in accordance with the exemplary embodiment of the present invention.

In a next step, an etching of the first polymer layer takes place, for example, using an O₂/CF₄-plasma. Since, in this context, it is substantially an isotropic etching step, first polymer layer 3 is removed even from beneath micropatterns 10. The pattern fabricated in this way is shown in FIG. 5. As can be seen, metal micropatterns 10, in each case, retain the remaining electroplating-starting layer 4 on their lower sides, and the side walls, in each case, are covered with insulating layer 9. In the area of contacting site 5, metal micropatterns 10 are permanently bonded to substrate 1. At this location, therefore, an electrical contact of metal micropattern 10 with the switching circuits arranged in substrate 1 is created. Furthermore, metal micropattern 10 has areas that are not permanently bonded to the substrate. Such areas can thus be movable relative to substrate 1, and they function as acceleration sensors or the like.

The metal micropattern formed in this way has the advantage that, although it is completely made of metal, it has insulated side walls. Since micropatterns of this type often receive electrical voltage and, because of their movability, can come into direct contact with each other, short circuits can arise. In this context, very high current densities can flow in the contact area, resulting in damage to the micropatterns or to the electrical switching circuits connected to the micropatterns. The metal micropatterns according to the present invention avoid these disadvantages because the micropatterns are laterally insulated from each other. In addition, ohmically separated metal patterns can be fabricated such as are necessary for the construction of relays.

Figure 6:
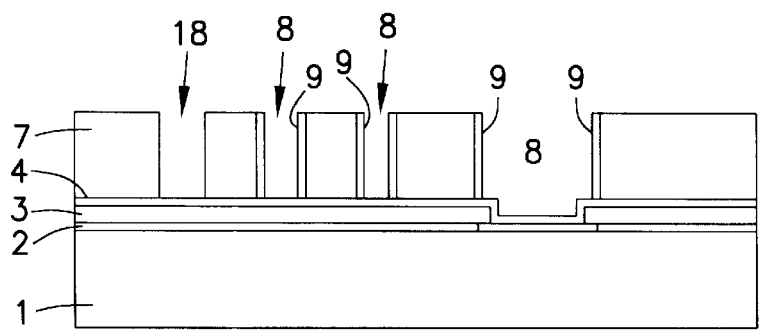
FIG. 6 depicts a second embodiment of the method of the present invention.

FIG. 6 depicts a variation of the method in accordance with the present invention, which proceeds from a processing stage as depicted in FIG. 2. Proceeding from FIG. 2, a further patterning step occurs in which an additional trench 18 is introduced into second polymer layer 7. This can occur, for example, by depositing on the upper side of second polymer layer 7 a further mask layer, which then functions to pattern additional trench 18. Alternatively, it is also possible from the very beginning to provide a two-layer mask, which is built up, for example from a variably thick silicon dioxide layer or a double layer is built up from silicon oxide and silicon nitride. In a first step, then, only those mask openings are exposed which are necessary for etching trench 8, and after insulating layer 9 is formed on the side walls, in a further step, the mask opening is exposed for additional trench 18, and then trench 18 is etched. After etching additional trench 18, the mask layer is then completely removed, as is shown in FIG. 6.

What is claimed is:

1. A method for creating a metal micropattern, comprising the steps of:

creating a plurality of trenches for the metal micropattern in a polymer layer, each of the plurality of trenches having respective side walls;

producing an insulating layer only on each of said side walls of the plurality of trenches;

after the producing step, filling each of the plurality of trenches with the metal micropattern using an electroplating process; and after the filling step, removing the polymer layer without removing the insulating layer on the respective side walls of each of the plurality of trenches.

2. The method according to claim 1, wherein each of the plurality of trenches has a respective base, and wherein the step of producing the insulating layer includes the steps of:

covering substantially all of a surface of the polymer layer with the insulating layer after performing the step of creating the plurality of trenches, and removing a portion of the insulating layer from at least each respective base of the plurality of trenches using one of an anisotropic plasma etching process and an ion-etching process.

3. The method according to claim 1, further comprising the step of:

arranging an electroplating-starting layer under the polymer layer.

4. The method according to claim 3, further comprising the steps of:

arranging a sacrificial layer under a first portion of the electroplating-starting layer, the first portion of the electroplating-starting layer being under first ones of the plurality of trenches; and arranging a contacting site under a second portion of the electroplating-starting layer, the second portion of the electroplating-starting layer being under second ones of the plurality of trenches.

5. The method according to claim 4, further comprising the step of:

arranging the contacting site on a semiconductor substrate including a semiconductor circuit, the contacting site contacting the semiconductor circuit.

6. The method according to claim 1, wherein the step of producing the insulating layer includes the step of depositing, using a plasma deposition method, at least one of a silicon oxide layer and a silicon nitride layer.

7. The method according to claim 1, further comprising the steps of:

creating an additional trench in the polymer layer after performing the step of producing the insulating layer; and filling the additional trench with the metal micropattern.

8. The method according to claim 1, wherein the step of creating the plurality of trenches includes the step of plasma etching the plurality of trenches into the polymer layer.

* * * * *